(12) United States Patent
Wystup

(10) Patent No.: US 11,105,711 B2
(45) Date of Patent: Aug. 31, 2021

(54) METHOD FOR MONITORING ROLLING BEARINGS

(71) Applicant: ebm-papst Mulfingen GmbH & Co. KG, Mulfingen (DE)

(72) Inventor: Ralph Wystup, Künzelsau (DE)

(73) Assignee: ebm-papst Mulfingen GmbH & Co. KG, Mulfingen (DE)

(*) Notice: Subject to any disclaimer, the term of this patent is extended or adjusted under 35 U.S.C. 154(b) by 0 days.

(21) Appl. No.: 16/761,747

(22) PCT Filed: Nov. 2, 2018

(86) PCT No.: PCT/EP2018/080012
§ 371 (c)(1),
(2) Date: May 5, 2020

(87) PCT Pub. No.: WO2019/086606
PCT Pub. Date: May 9, 2019

(65) Prior Publication Data
US 2020/0264073 A1    Aug. 20, 2020

(30) Foreign Application Priority Data
Nov. 6, 2017 (DE) .......................... 102017125890.6

(51) Int. Cl.
*G01M 13/04*  (2019.01)
*G01D 5/244*  (2006.01)
*F16C 19/06*  (2006.01)

(52) U.S. Cl.
CPC ............ *G01M 13/04* (2013.01); *G01D 5/244* (2013.01); *F16C 19/06* (2013.01); *F16C 2233/00* (2013.01); *F16C 2380/26* (2013.01)

(58) Field of Classification Search
CPC .. F16C 19/52; F16C 2233/00; F16C 2380/26; G01D 5/244; G01D 5/24457; G01D 5/24466; G01M 13/04; H02K 7/08
(Continued)

(56) References Cited

U.S. PATENT DOCUMENTS 5,226,736 A * 7/1993 Becker .................... F16C 19/52
  384/448
5,277,543 A * 1/1994 Noguchi ............. F04D 15/0272
  367/99

(Continued)

FOREIGN PATENT DOCUMENTS

DE          4123576     2/1992
DE       102009044509    5/2011
(Continued)

OTHER PUBLICATIONS

German International Search Report dated Jan. 11, 2019.

*Primary Examiner* — Phillip A Johnson
(74) *Attorney, Agent, or Firm* — Dickinson Wright PLLC

(57) ABSTRACT

The present disclosure relates to a method and an apparatus for monitoring a rolling bearing of an electric motor, wherein the rolling bearing forms a capacitive parasitic antenna, having the following steps of: a. capturing the electromagnetic spectrum emitted by the parasitic antenna in a manner triggered by spark formation in the rolling bearing over a respectively defined period t during operation of the electric motor; b. evaluating the number N of electromagnetic pulses (a, b, c, d, e) received in the spectrum and the amplitude A of said pulses; c. capturing the change in the number N of electromagnetic pulses (a, b, c, d, e) and/or the amplitude A of said pulses, and d. determining whether the increase in the number N and/or in the amplitudes A of the electromagnetic pulses (a, b, c, d, e) increases in a non-linear manner with time.

11 Claims, 3 Drawing Sheets

(58) Field of Classification Search
USPC .......................................................... 702/38
See application file for complete search history.

(56) References Cited

U.S. PATENT DOCUMENTS

2010/0058868 A1* 3/2010 Claus ...................... F16C 19/52
73/593
2012/0319636 A1 12/2012 Gattermann et al.

FOREIGN PATENT DOCUMENTS

| EP | 1826735 | 8/2007 |
| EP | 2131177 | 12/2009 |
| JP | H0273499 | 3/1990 |
| WO | 94024537 | 10/1994 |
| WO | 98036251 | 8/1998 |

* cited by examiner

METHOD FOR MONITORING ROLLING BEARINGS

RELATED APPLICATIONS

This application claims priority to German Patent Application No. 10 2017 125 890.6, filed Nov. 6, 2017, and PCT/EP2018/080012, filed Nov. 2, 2018, the entire contents of which are incorporated herein by reference in their entirety.

FIELD

The present disclosure relates to a method and an apparatus for monitoring rolling bearings in an electric machine such as an EC motor.

BACKGROUND

Nowadays, variable-speed motors are largely powered by intermediate circuit voltage converters. Powering an electric machine from a pulse-controlled inverter may for example form a capacitively coupled bearing voltage. The inverter switched pulse pattern results in a common mode voltage (CMV) jumping in accordance with the inverter switching frequency versus ground.

Powering by the intermediate circuit voltage converter may therefore lead to undesirable bearing voltages, which in turn may lead to bearing currents in the motor bearings. Such a current flow through the bearings may lead to damage and even complete failure in electric machines with rolling and sliding bearings. It is therefore desirable to avoid damage on the one side, and on the other side there is a demand for monitoring the state of such a rolling bearing.

As a solution for reducing damage to the rolling bearing, current-insulated and electrically insulated bearings, respectively, e.g. bearings having a ceramic insulation at the outer ring or hybrid bearings having ceramic rolling elements, were used in the past. However, as these bearings are very expensive, such a solution is not ideally suited for mass production.

Further remedial action is known in the prior art. As such, the documents EP 1 445 850 A1 and DE 10 2004 016 738 B3, respectively, teach the use of an apparatus for protecting an electric machine bearing providing a compensation arrangement or a compensation device for producing a compensation current for the compensation of an interference current through the bearings.

Irrespective of the construction of the EC motor and the conception for avoiding damage to the bearing, it is however desirable to know the current state of the bearing and determine possible damage to the bearing.

BRIEF SUMMARY

The main object of a method for monitoring the state of the bearings specifically of rotating or rotary machines such as EC motors is to enable an assessment of the current bearing state and any changes of that state without any operational interruptions, if possible. Bearing state herein relates to assessing the technical state of the bearing regarding the change of the bearing due to spark erosion.

Through preventive maintenance and empirical data, the availability of EC motors may certainly be improved while simultaneously reducing downtime as well as maintenance costs. However, the downside is that it is rarely possible to accurately predict the state, wear and timing of bearing breakdown. Furthermore, early replacement of parts having a high residual life is a common occurrence in preventive maintenance. Thus, there is a need for a method ascertaining the bearing state as accurately as possible without the need for complex sensors, vibration analyses and the like.

It is therefore the object of the disclosure to overcome previously mentioned drawbacks and provide a reliable and inexpensively achievable solution for monitoring the bearing state and specifically for detecting damage to the rolling bearing.

This object is achieved with the characteristics of claim 1.

The fundamental concept of the disclosure can be seen in that through measuring high frequency radio emissions between the bearing balls and track resulting from spark formation a conclusion to the bearing quality can be drawn from the resulting electromagnetic waves.

As is known, for example, from an electric door bell and an adjacently placed radio, an electric spark (spark discharge) produces a high frequency electromagnetic wave which can couple to the radio antenna. The same phenomenon occurs between bearing race and bearing ball at the surface. The spark current leading to the electric spark is the previously described bearing current which together with the rotation of bearing parts (balls and race of the balls in the bearing) causes a type of spark erosion. Depending on the bearing damage state, a certain number of sparks are produced per unit of time and a respective number of particular electromagnetic waves are broadcast by the antenna (parasitic antenna) coupled to the spark gap (balls to race), which is given by the mechanical construction of the bearing.

Due to said spark erosion, the bearing damage further increases in number and extent with time, the increase of bearing damage however does not act in a linear manner in time. The amount of bearing damage already present in the balls of the rolling bearing also affects the formation of further bearing damage in addition to the actual erosion process, as the necessary positioning between bearing track and ball surface is thereby impaired.

This means that at a receiver for the electromagnetic waves or pulses, respectively, in a particular (specific to damage) frequency band determined by the parasitic antenna of the ball bearing the captured number and the ascertained amplitude of the electromagnetic pulses increases in a non-linear manner through spark formation by time unit.

According to the disclosure, using the evaluation of the electromagnetic pulses in a particular time interval for determining the bearing state is thus proposed. By evaluating these pulses, namely by forming a mean value of the signals at the receiver output and by subsequently calculating the mean value change rate, conclusions to the bearing state may be drawn. The ascertained mean value rises and changes at increasing speed with increasing bearing damage.

According to the disclosure, it is therefore proposed that the measured electromagnetic spectrum is subjected to a spectral analysis, such that the number of electromagnetic pulses across a defined time unit, the mean value of the electromagnetic pulses across that time, and the time differential of the mean values are formed. Through this, according to the disclosure, it is possible to monitor the bearing state using a receiving antenna and an evaluation device in a cost effective manner.

The use of reference data provides a preferred analysis and prognosis option. To this end, a respective reference model is designed for the respective EC motor. The reference model comprises a data set having the electromagnetic pulses of a particular frequency band for different bearing states in which bearing damage of a rolling bearing is respectively present to varying degrees. A non-linear bearing state plot is extrapolated for several bearing states representing the non-linear gradient of a bearing damage. It is especially beneficial to not ascertain or extrapolate the plot itself but rather the mean value plot and to define a maximum differential as absolute threshold differential beyond which the bearing will be considered "defective". Thus, when the increase of electromagnetic pulses per time interval exceeds the threshold differential value, an error signal may, for example, be outputted.

With regards to industry 4.0 applications, for example, defining a second threshold value (relative threshold differential) that represents a state against time situated before reaching the absolute threshold differential (defective bearing) and that predicts the soon to be expected bearing defect may be proposed. The breakdown time may be predicted based on the actual plot gradient and the average operation time such that not only the current state but also the predicted course of the bearing state may be captured using the disclosure such that preventative maintenance may be implemented.

Thus, a requisition may be triggered fully automatically, for example, when the threshold value of the relative threshold differential is detected.

To reduce interferences caused by other sources of interference, such as, for example, radio emitters, sources of interference in the motor etc., while measuring, a preferred embodiment of the disclosure proposes that the receiver only detects a particular frequency band of electromagnetic waves. It is especially advantageous if this frequency band is selectively tuned to the resonant frequency of the EC motor parasitic sending antenna.

In another advantageous embodiment of the disclosure it is proposed that not only one single bearing in the EC motor but, depending on the frequency and as such depending on the tuning of the parasitic antenna(e) to the receiving frequency/ies, multiple bearings in the motor are monitored. To achieve this, the parasitic antennae must however be tuned to the resonant frequency via additional reactance (inductivity and capacitances).

This has no significant impact on spark formation as such as the spark itself always broadcasts a comparatively wideband frequency band of electromagnetic waves.

Another aspect of the present disclosure relates to an EC motor with a bearing monitoring device comprising a receiving antenna and an evaluation device for evaluating the electromagnetic waves.

In a preferred embodiment of the disclosure, the receiving antenna is proposed to be arranged directly on the printed-circuit board of the motor.

BRIEF DESCRIPTION OF THE DRAWINGS

Other advantageous developments of the disclosure are characterized in the dependent claims or are further detailed below in conjunction with the description of the preferred embodiment of the disclosure based on the figures.

The following show.

DETAILED DESCRIPTION

Figure 1:
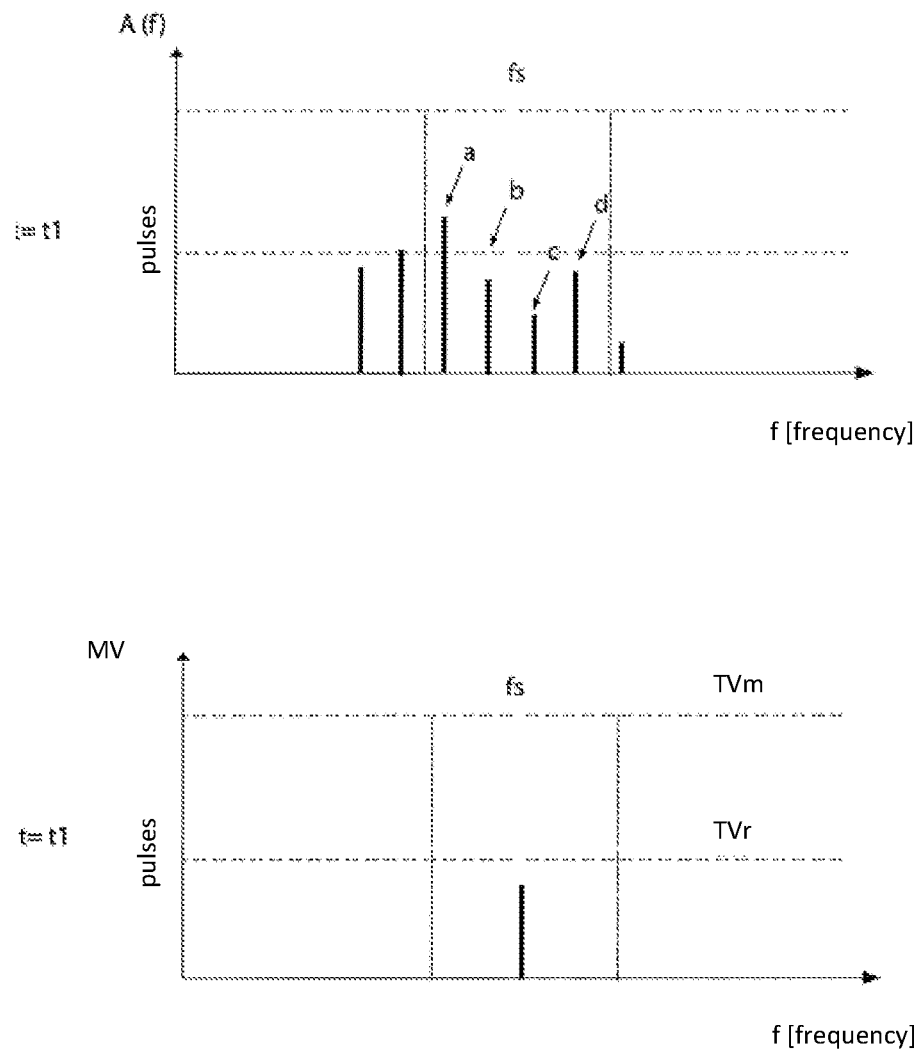
FIG. 1 a simplified graph of the spectral lines of a frequency spectrum at a first time t=t1 according to the present disclosure.

The disclosure will subsequently be described in further detail based on preferred exemplary embodiments with reference to the FIGS. 1 to 4, wherein same reference numerals indicate same functional and/or structural characteristics.

Figure 2:
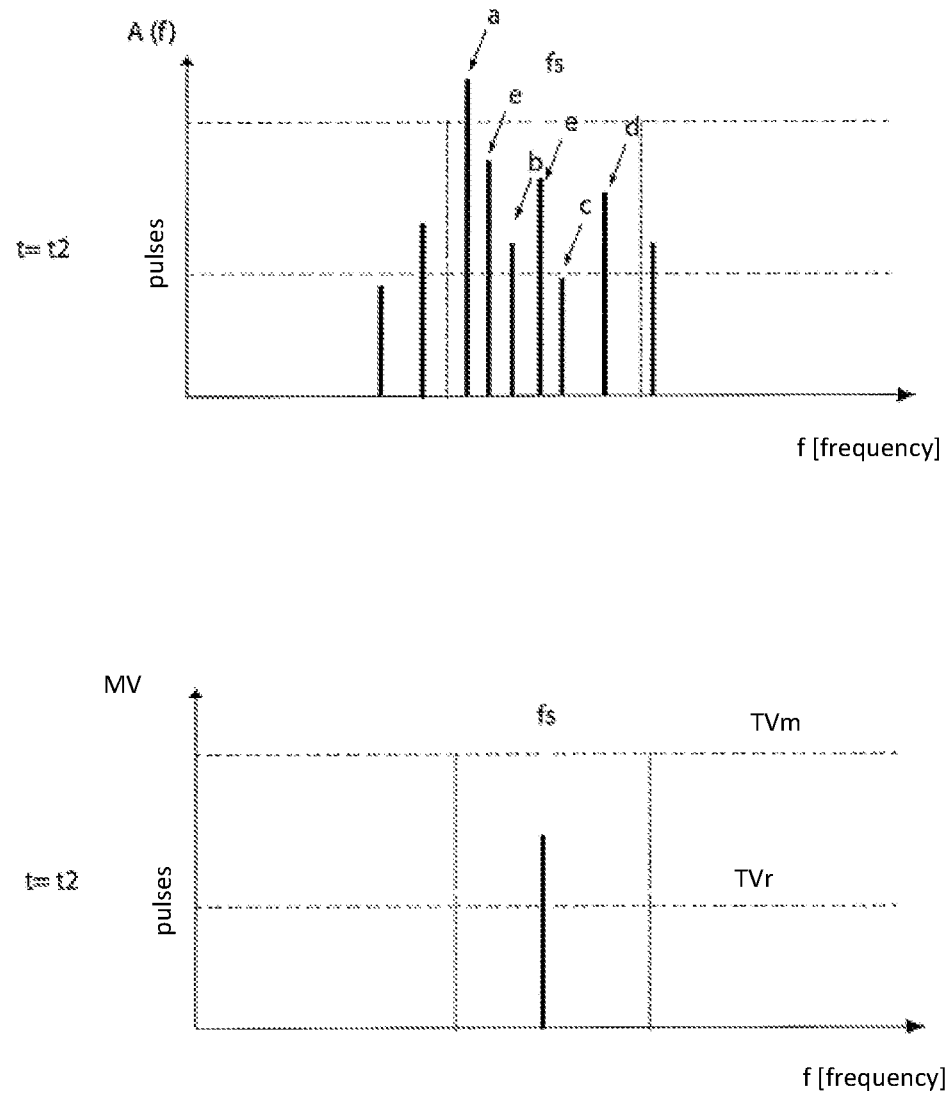
FIG. 2 a simplified graph of the spectral lines of a frequency spectrum at a second (later) time t=t2 according to the present disclosure.

The FIGS. 1 and 2 each show a simplified graph of the spectral lines of a frequency spectrum A(f) with the amplitude A at a first time t=t1 and a later time t=t2. The spectral lines a, b, c, d are each meant to represent bearing damage in the rolling bearing 2 and present the respective amplitudes in the frequency spectrum. These are shown in the FIGS. 1 and 2 merely exemplary as discrete spectral lines. The degree of bearing damage is ascertained across the amplitude A. The higher the amplitude and the respective addition, the higher the bearing damage. Presently merely 7 such spectral lines from the (not represented) frequency spectrum are shown exemplary in FIG. 1, whereas in FIG. 2 additional damage was added exemplary (represented by the spectral line e).

Figure 4:
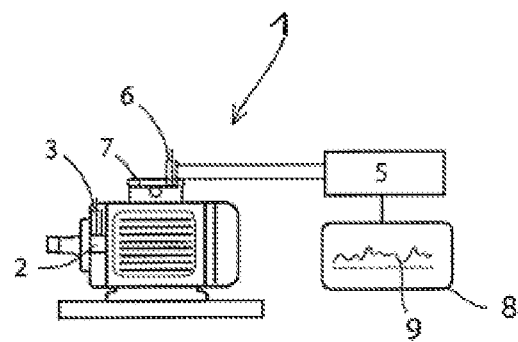
FIG. 4 an exemplary equivalent circuit diagram of an electric motor with a bearing monitoring device.

These spectral lines a, b, c, d, e are used in the monitoring of the rolling bearing 2 of an electric motor 1 shown in FIG. 4. It is presumed that the rolling bearing 2 to be monitored forms a capacitive parasitic antenna 3 emitting electromagnetic waves due to spark formation in rolling bearing 2 due to present bearing damage.

The electric motor 1 is equipped with a bearing monitoring device 5 as shown in the equivalent circuit diagram of FIG. 4 having at least one receiving antenna 6 mounted preferably directly onto the printed-circuit board 7 of the electric motor 1.

After capturing the electromagnetic spectrum emitted by the parasitic antenna 3 in a manner triggered by spark formation in rolling bearing 2 across a respectively defined period t during operation of the electric motor 1, evaluating the number N of electromagnetic pulses contained in the frequency spectrum and the amplitude A of said pulses as well as a formation of a mean value of the pulses a, b, c, d, e contained in the frequency band fs (the area between the dashed lines) to be evaluated, occurs.

By capturing the change to the mean value of the number N of electromagnetic pulses a, b, c, d, e in said frequency band fs and/or the amplitude A of said pulses across a plurality of consecutive times during operation of the electric motor, a conclusion regarding the bearing state can be drawn from the change rate.

Figure 3:
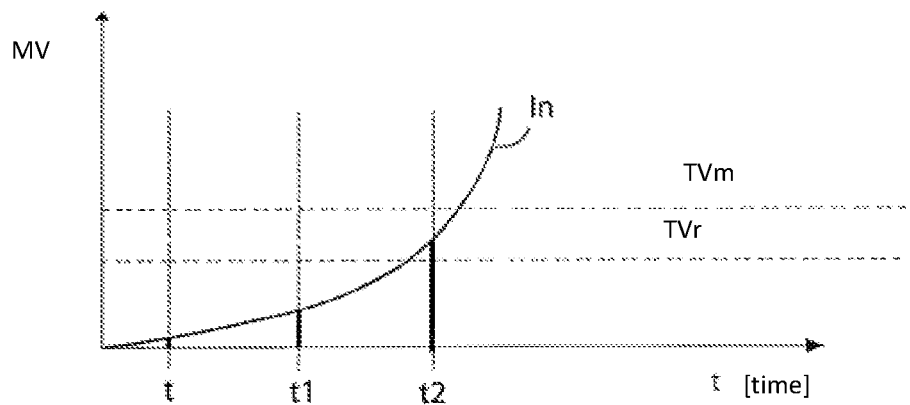
FIG. 3 an extrapolated plot of the change rate of the captured electromagnetic pulse mean values starting from bearing damage.

Specifically, one exemplary embodiment may propose the plotting of mean values at the respective capture times across time. The result is a non-linear plot as shown in FIG. 3, as the change rate increases with time. As such, the increase rate from time t1 to time t2 is less than the subsequent change over the respective same time interval as the bearing damage increase in a non-linear manner there. Furthermore, in FIGS. 1 to 3, merely exemplary threshold values are marked, namely the first threshold value TVr and the second threshold value TVm, wherein the first threshold value is to define a state where an expected residual life corresponds to a defined value calculated from the previous change rate and the operation time at which the change rate is obtained when reaching the time of the first threshold value.

In FIG. 4, a display 8 for displaying a spectrum 9 ascertained by the bearing monitoring device 5 is shown to graphically represent the results for a person and, if applicable, visually render signals, warnings or the like in an easy manner for a user of the motor. It is advantageous for the bearing monitoring device 5 to already form an integral part of the motor electronics.

The invention claimed is:

1. A method for monitoring a rolling bearing of an electric motor, wherein the rolling bearing forms a capacitive parasitic antenna, having the steps of:
    capturing the electromagnetic spectrum emitted by the parasitic antenna in a manner triggered by spark formation in the rolling bearing over a respectively defined period t during operation of the electric motor;
    evaluating the number N of electromagnetic pulses (a, b, c, d, e) received in the spectrum and the amplitude A of said pulses;
    capturing a change in the number N of electromagnetic pulses (a, b, c, d, e) and/or the amplitude A of said pulses, and determining whether the change in the number N and/or in the amplitudes A of the electromagnetic pulses (a, b, c, d, e) increases in a non-linear manner with time.

2. The method according to claim 1, wherein, for determining the change of the number N and/or the amplitude of the electromagnetic pulses (a, b, c, d, e) in step d), a mean value of the amplitudes A is formed, and the change of the mean value is used in identifying the bearing state.

3. The method according to claim 2, wherein the formation of the mean value is a weighted formation of the mean value.

4. The method according to claim 3 wherein an ascertained change rate is compared to reference data, including at least one predetermined maximum threshold value (TVm), and wherein a signal is produced at least when exceeding the threshold value (TVm).

5. The method according to claim 4, wherein ascertained change rate is compared to at least a second predetermined threshold value (TVr) that is less than the maximum threshold value (TVm) and a signal is produced when exceeding the second threshold value (TVr).

6. The method according to claim 2 wherein the change increase of the mean value as a change rate in the form of a time differential is ascertained and subsequently analyzed to determine whether the change rate increases in a non-linear manner.

7. The method according to claim 1, wherein only the electromagnetic pulses within a selected narrow frequency band fs within a wide-band frequency band of the emitted electromagnetic waves are captured.

8. An electric motor having at least one rolling bearing, the state of which is monitored via a bearing monitoring device, wherein the electric motor is formed to carry out the method according to claim 1.

9. The electric motor according to claim 8, wherein the electric motor uses a receiving antenna integrated in the motor to capture the electromagnetic pulses.

10. The electric motor according to claim 8 wherein the electric motor includes several rolling bearings, the state of the several rolling bearings being monitored via the monitoring device, wherein each single parasitic antennae of the several rolling bearings is provided with respectively one inductive and/or capacitive reactance to tune the respective parasitic antenna to its resonant frequency.

11. The electric motor according to claim 8 wherein an evaluation device for evaluating the electromagnetic waves is provided integrally in or at the electric motor.

* * * * *